(12) United States Patent
Avvaru et al.

(10) Patent No.: US 11,019,748 B2
(45) Date of Patent: May 25, 2021

(54) SUSPENDED FAN MODULES

(71) Applicant: Seagate Technology LLC, Cupertino, CA (US)

(72) Inventors: Vivekananda Avvaru, Bangalore (IN); Shankar Gopalakrishna, Bangalore (IN); Saju Cheeran Verghese Francis, Bangalore (IN); Odie Killen, Monument, CO (US)

(73) Assignee: Seagate Technology LLC, Fremont, CA (US)

( * ) Notice: Subject to any disclaimer, the term of this patent is extended or adjusted under 35 U.S.C. 154(b) by 157 days.

(21) Appl. No.: 15/853,203

(22) Filed: Dec. 22, 2017

(65) Prior Publication Data

US 2019/0200481 A1    Jun. 27, 2019

(51) Int. Cl.
| | | |
|---|---|---|
| *H05K 7/20* | (2006.01) | |
| *H05K 7/14* | (2006.01) | |
| *F21V 33/00* | (2006.01) | |
| *G11B 33/14* | (2006.01) | |
| *F21Y 115/10* | (2016.01) | |

(52) U.S. Cl.
CPC ..... *H05K 7/20172* (2013.01); *F21V 33/0096* (2013.01); *G11B 33/142* (2013.01); *H05K 7/1421* (2013.01); *H05K 7/1487* (2013.01); *H05K 7/1489* (2013.01); *H05K 7/20727* (2013.01); *F21Y 2115/10* (2016.08)

(58) Field of Classification Search
CPC .............. G06F 1/181–182; G06F 1/20; H05K 7/20218–20381; H05K 7/20409–20418; H05K 7/20009–202; H05K 7/20172; H05K 7/1421; H05K 7/1487; H05K 7/1489; H05K 7/20727; H05K 7/20809; H05K 7/20818; H01L 23/367–3677; H01L 23/473; H01L 23/46–467; F21V 33/0096; F21V 93/0096; F21Y 2115/10; G11B 33/142
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/148; 312/236

See application file for complete search history.

(56) References Cited

U.S. PATENT DOCUMENTS

| | | |
|---|---|---|
| 5,788,566 A | 8/1998 | McAnally et al. |
| 6,375,440 B2 | 4/2002 | Kosugi |
| 6,592,327 B2 | 7/2003 | Chen et al. |
| 7,251,135 B2 | 7/2007 | Crippen et al. |
| 7,408,772 B2 | 8/2008 | Grady et al. |
| 7,599,175 B1 | 10/2009 | Ong et al. |
| 7,746,652 B2 | 6/2010 | Horng et al. |
| 8,031,467 B2 | 10/2011 | Cheng et al. |
| 8,300,404 B2 * | 10/2012 | Tan .................... G06F 1/183 248/68.1 |
| 8,432,695 B2 * | 4/2013 | Yoshikawa ......... H01L 23/4006 165/185 |

(Continued)

*Primary Examiner* — Adam B Dravininkas
(74) *Attorney, Agent, or Firm* — Faegre Drinker Biddle & Reath

(57) ABSTRACT

A system includes a drawer and a fan assembly. The drawer includes a mounting structure with a support surface and an aperture. The fan assembly extends through the aperture and includes a fan module and a top cover. The top cover is coupled to the support surface.

20 Claims, 5 Drawing Sheets

(56) References Cited

U.S. PATENT DOCUMENTS

| | | | |
|---|---|---|---|
| 8,939,721 B2* | 1/2015 | Chiu | F04D 29/601 415/213.1 |
| 9,565,785 B2 | 2/2017 | Tsai | |
| 9,615,480 B2 | 4/2017 | Pronozuk et al. | |
| 9,699,941 B2 | 7/2017 | Alvarado et al. | |
| 2004/0000395 A1* | 1/2004 | Lin | H01L 23/467 165/125 |
| 2004/0162018 A1* | 8/2004 | Lee | F04D 29/601 454/184 |
| 2004/0190246 A1* | 9/2004 | Arbogast | H05K 7/20172 361/695 |
| 2004/0256334 A1* | 12/2004 | Chen | H05K 7/20727 211/41.17 |
| 2005/0036287 A2* | 2/2005 | Kosugi | F04D 29/646 361/695 |
| 2005/0105269 A1* | 5/2005 | Chen | H05K 7/20172 361/695 |
| 2005/0237712 A1* | 10/2005 | Li | G06F 1/183 361/679.48 |
| 2005/0238494 A1 | 10/2005 | Lien et al. | |
| 2006/0196643 A1* | 9/2006 | Hata | G06F 1/1616 165/104.33 |
| 2006/0279929 A1* | 12/2006 | Chen | G06F 1/20 361/697 |
| 2007/0053159 A1 | 3/2007 | Crippen et al. | |
| 2007/0064386 A1* | 3/2007 | Peng | G06F 1/183 361/679.48 |
| 2008/0107479 A1 | 5/2008 | Yang | |
| 2008/0232062 A1* | 9/2008 | Lee | F04D 29/601 361/679.48 |
| 2008/0259562 A1* | 10/2008 | Chen | H05K 7/20727 361/690 |
| 2009/0016878 A1 | 1/2009 | Huang et al. | |
| 2009/0034191 A1* | 2/2009 | Yin | F04D 25/0613 361/695 |
| 2009/0059521 A1* | 3/2009 | Yin | F04D 25/166 361/695 |
| 2009/0195979 A1* | 8/2009 | Ji | H05K 7/20727 361/679.48 |
| 2009/0231803 A1* | 9/2009 | Chang | G06F 1/181 361/679.47 |
| 2010/0014250 A1* | 1/2010 | Kitahara | A61B 8/12 361/695 |
| 2010/0027215 A1* | 2/2010 | Wu | G06F 1/20 361/679.48 |
| 2010/0108847 A1 | 5/2010 | Li | |
| 2010/0142143 A1 | 6/2010 | Ong et al. | |
| 2010/0300648 A1* | 12/2010 | Grantham | H05K 7/20745 165/55 |
| 2011/0076932 A1 | 3/2011 | Li | |
| 2011/0122573 A1* | 5/2011 | Peng | G06F 1/20 361/679.48 |
| 2011/0141687 A1* | 6/2011 | Li | G06F 1/20 361/679.48 |
| 2011/0255238 A1* | 10/2011 | Tan | H05K 7/20727 361/679.48 |
| 2012/0026678 A1* | 2/2012 | Rodriguez | G06F 1/20 361/679.48 |
| 2012/0085883 A1 | 4/2012 | Lu | |
| 2012/0113591 A1* | 5/2012 | Chuang | H05K 7/20172 361/695 |
| 2012/0140383 A1 | 6/2012 | Chiang | |
| 2012/0148397 A1* | 6/2012 | Tsai | G06F 1/20 415/213.1 |
| 2012/0162915 A1* | 6/2012 | Gong | G06F 1/20 361/695 |
| 2012/0163970 A1 | 6/2012 | Shu et al. | |
| 2012/0243178 A1* | 9/2012 | Zhang | G06F 1/187 361/695 |
| 2013/0064650 A1 | 3/2013 | Wang et al. | |
| 2013/0128451 A1* | 5/2013 | Chiu | G06F 1/20 361/679.48 |
| 2013/0265725 A1 | 10/2013 | Harvilchuck | |
| 2013/0314865 A1* | 11/2013 | Chuang | G06F 1/26 361/679.02 |
| 2014/0140085 A1* | 5/2014 | Matsumoto | F21S 41/148 362/516 |
| 2014/0160652 A1* | 6/2014 | Cai | G06F 1/188 361/679.02 |
| 2014/0185313 A1* | 7/2014 | Hashimoto | F04D 29/601 362/555 |
| 2014/0211418 A1* | 7/2014 | Arreola | H05K 7/20172 361/695 |
| 2015/0056034 A1 | 2/2015 | Anson et al. | |
| 2015/0070843 A1* | 3/2015 | Mao | H05K 7/20172 361/695 |
| 2015/0092342 A1* | 4/2015 | Peng | F04D 25/0613 361/679.48 |
| 2015/0109731 A1* | 4/2015 | Umematsu | H05K 7/20772 361/691 |
| 2015/0138770 A1* | 5/2015 | Kwak | F21V 5/04 362/244 |
| 2015/0351280 A1* | 12/2015 | Gonzalez Inda | G06F 1/181 361/695 |
| 2016/0029519 A1* | 1/2016 | Chen | H05K 7/20727 361/679.48 |
| 2016/0037685 A1 | 2/2016 | Ross | |
| 2016/0088766 A1* | 3/2016 | Bell | G11B 33/128 361/679.48 |
| 2016/0135322 A1* | 5/2016 | Chen | G11B 33/142 361/679.46 |
| 2016/0381836 A1* | 12/2016 | Hall | H05K 7/20718 361/679.48 |
| 2017/0086332 A1* | 3/2017 | Jaskela | H05K 7/1487 |
| 2017/0114803 A1 | 4/2017 | Miwa | |
| 2017/0131750 A1* | 5/2017 | Sato | G06F 1/20 |

\* cited by examiner

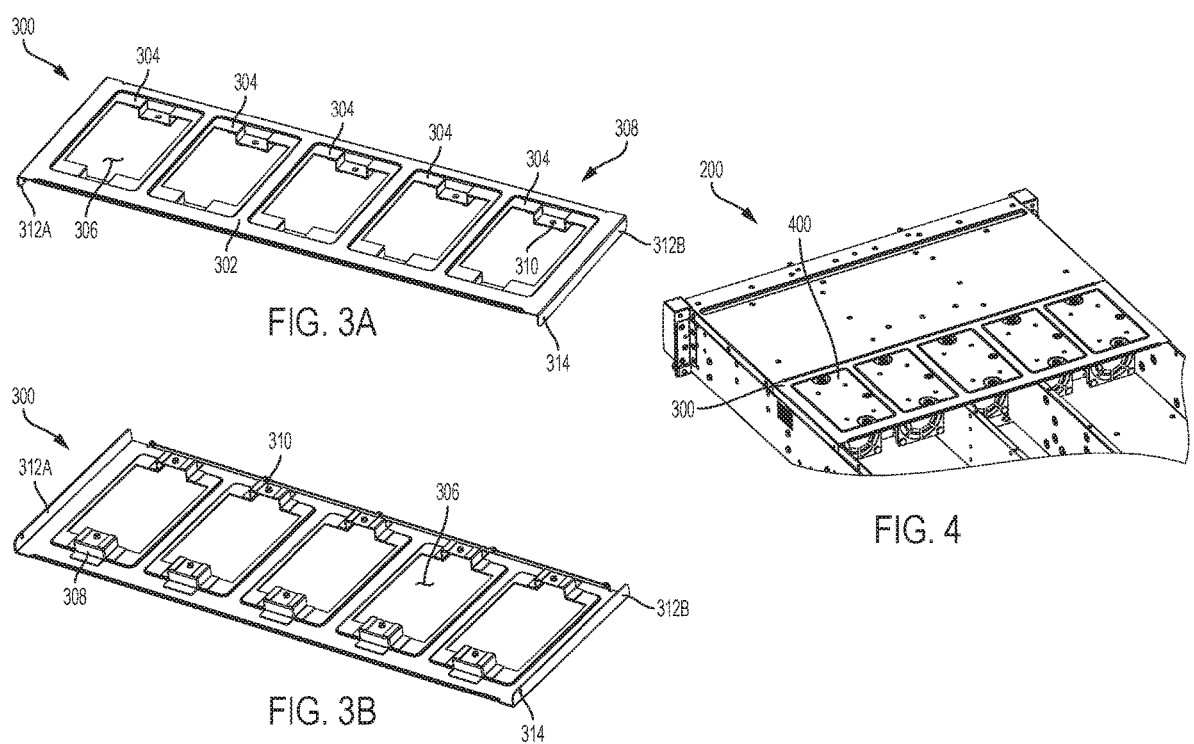

SUSPENDED FAN MODULES

SUMMARY

In certain embodiments, a system includes a drawer and a fan assembly. The drawer includes a mounting structure with a support surface and an aperture. The fan assembly extends through the aperture and includes a fan module and a top cover. The top cover is coupled to the support surface.

In certain embodiments, a fan assembly includes a fan module having a first set of mounting openings and a second set of mounting openings, a front cover coupled to the fan module via a first set of dampers that extend through respective openings of the first set of mounting openings, a back cover coupled to the fan module via a second set of dampers that extend through respective openings of the second set of mounting openings, and a top cover coupled to the fan module.

In certain embodiments, a method is disclosed for installing a fan assembly into a drawer of a data storage system. The drawer includes a mounting structure having an aperture, a support surface, and tapped mounting openings. The fan assembly includes a top cover coupled to a fan module. The method includes inserting the fan assembly into the aperture such that the fan module extends through the aperture and the top cover rests on the support surface, inserting first and second threaded fasteners through respective openings of the top cover, and rotating the first and second threaded fasteners to couple the first and second threaded fasteners to respective tapped mounting openings.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

BRIEF DESCRIPTION OF THE DRAWINGS

FIG. 3A shows a perspective top view of a mounting structure, in accordance with certain embodiments of the present disclosure.

FIG. 3B shows a perspective bottom view of the mounting structure of FIG. 3B.

FIG. 4 shows a partial, perspective top view of the drawer of FIG. 2.

Figure 1:
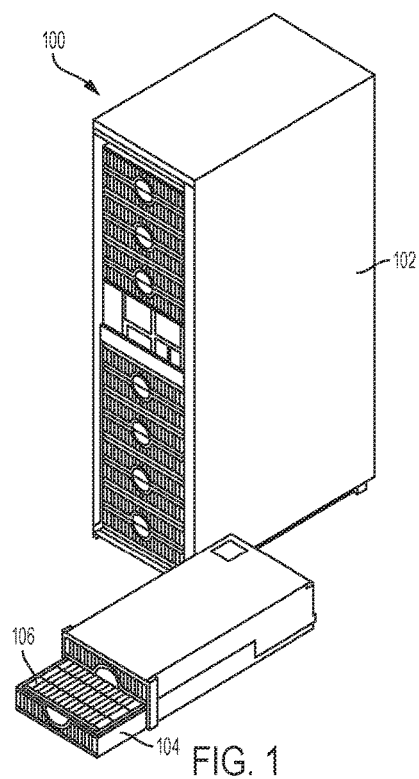
FIG. 1 shows a perspective view of a storage system, in accordance with certain embodiments of the present disclosure.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope the appended claims.

DETAILED DESCRIPTION

Data storage systems are used to store and process vast amounts of data. These systems are space constrained, and it can be challenging to keep the systems within a desired temperature range because of the amount of heat the systems typically generate during operation. Further, to avoid overheating, it may be important to be able to quickly replace failed parts, such as cooling devices (e.g., fans), because data storage systems usually operate non-stop. Certain embodiments of the present disclosure feature low-profile fan assemblies that can be incorporated into data storage systems, are simple to replace, have a relatively small footprint, and that can be mounted to provide flexibility for routing electrical components.

FIG. 1 shows a data storage system 100 including a rack 102 (e.g., a cabinet) with a plurality of drawers 104. Each drawer 104 can be configured as a sliding enclosure such that the drawer 104 can extend horizontally away from the rack 102 to expose a set of data storage devices 106 installed within the drawer 104.

Figure 2:
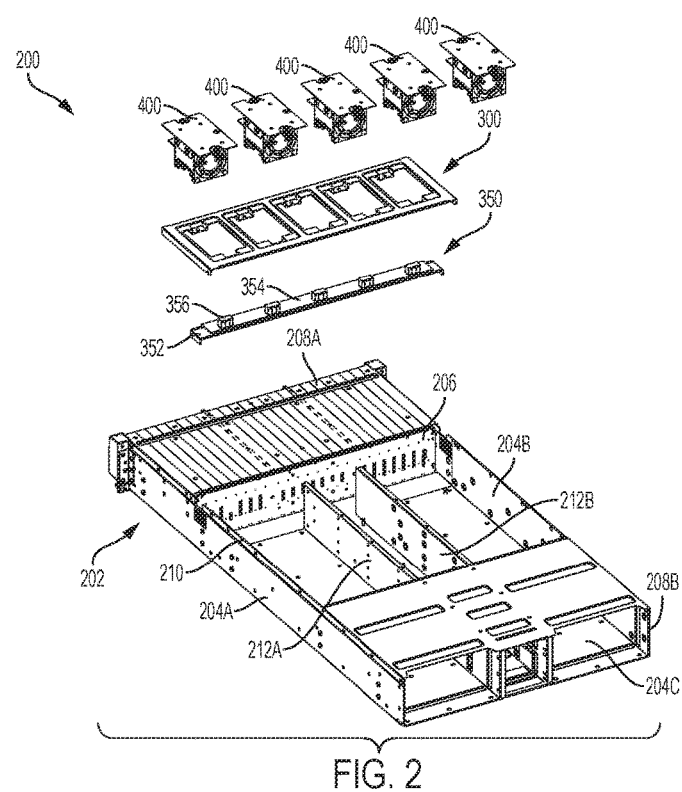
FIG. 2 shows an exploded, perspective view of a drawer, in accordance with certain embodiments of the present disclosure.

FIG. 2 shows an exploded view of a drawer 200, such as the drawer 104 in FIG. 1, which can be utilized in a data storage system such as the data storage system 100 of FIG. 1. FIG. 2 also shows a mounting structure 300, a control board assembly 350, and a plurality of fan assemblies 400.

The drawer 200 includes a chassis 202 with a first side wall 204A, a second side wall 204B, a bottom wall 204C, and a top cover (not shown). The chassis 202 forms an interior space for housing storage components (e.g., hard disc drives and/or solid state drives), electrical components (e.g., wiring and circuit boards), and cooling devices (e.g., fan modules). The drawer 200 shown in FIG. 2 includes a mid-plane circuit board 206, which is described in more detail below, positioned between a front end 208A and a back end 208B of the chassis 202. The first side wall 204A and the second side wall 204B can each include a top portion 210 that is thinner than the rest of the wall so that the top cover or other features can be coupled to the walls and provide a generally planar wall surface. The drawer 200 also includes two middle walls, 212A and 212B, that are part of or coupled to the chassis 202 and that can provide various mounting features and/or structure rigidity to the drawer 200.

FIGS. 3A and 3B show top and bottom view of the mounting structure 300 in FIG. 2, and FIG. 4 shows the mounting structure 300 and the fan assemblies 400 assembled with the drawer 200. Although the Figures show the drawer 200 including five fan assemblies 400, the drawer 200 can include fewer or more fan assemblies depending on the available space and cooling requirements.

Figure 5:
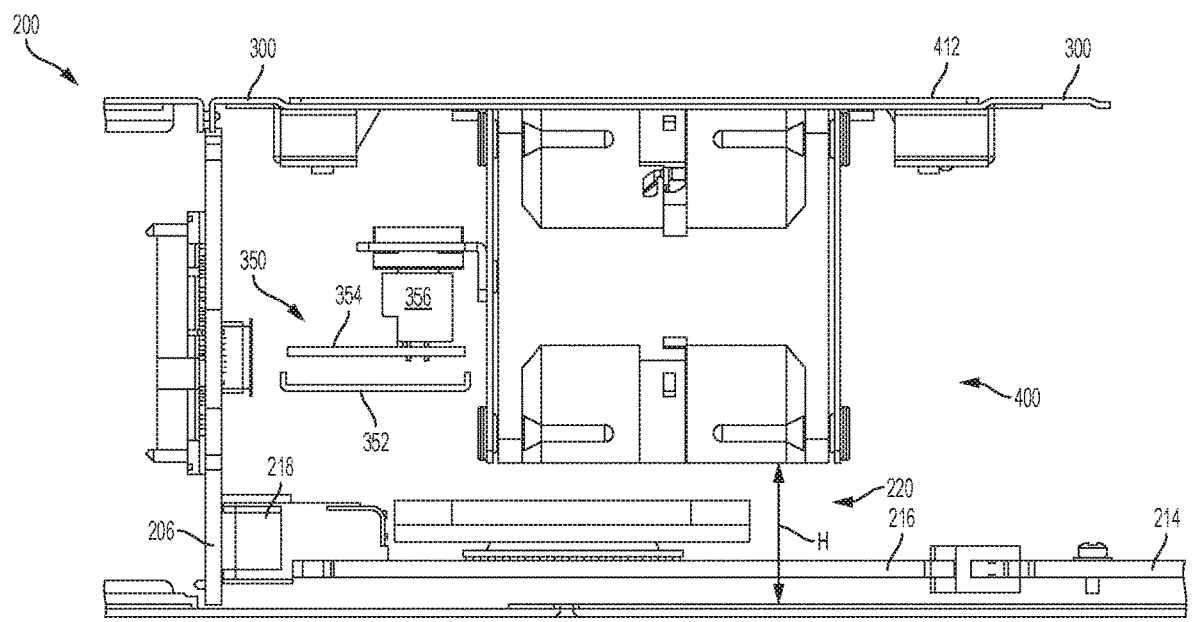
FIG. 5 shows a partial, side view of the drawer of FIG. 2 and a fan assembly, in accordance with certain embodiments of the present disclosure.

The mounting structure 300 includes a top surface 302 and a plurality of support surfaces 304. The support surfaces 304 delineate respective apertures 306. When the fan assemblies 400 are coupled to the mounting structure 300, each fan assembly 400 extends through one of the apertures 306 and rests on one of the support surfaces 304. The support surfaces 304 are recessed from the top surface 302 such that, when the fan assemblies 400 are coupled to the mounting structure 300, the fan assemblies 400 and the mounting structure 300 form a substantially planar surface, as shown in FIGS. 4 and 5, such that the drawer 200 can be slid into and out of a rack without the fan assemblies 400 interfering (e.g., hitting the rack). Although the fan assemblies 400 and the mounting structure 300 may form a generally planar surface, there may be gaps between the fan assemblies 400 and the mounting structure 300. In certain embodiments, to avoid interference, the fan assemblies 400 may be recessed from the top surface 302 when coupled to the mounting structure. The mounting structure 300 can be embossed, stamped, molded, etc., and comprise metals and/or plastics.

The mounting structure 300 can include mounting features 308 and/or mounting openings 310 that are shaped and/or arranged to provide structures that couple the fan assemblies 400 to the mounting structure 300. For example, the mounting features 308 can include surfaces recessed from the top surface 302 and/or the support surfaces 304 to accommodate fasteners, such that the fasteners do not extend past the top surface 302. Further, the mounting openings 310—and each of the various openings discussed throughout this disclosure—can be tapped such that threaded fasteners like screws can be secured to the mounting openings 310.

The mounting structure 300 further includes lips 312A and 312B or similar structures that couple the mounting structure 300 to the first side wall 204A and the second side wall 204B (e.g., the top portion 210 of the walls). The lips 312A and 312B can include openings 314 that align with openings in the first side wall 204A and the second side wall 204B such that a fastener (e.g., screw) can extend through respective openings to couple the mounting structure 300 to the first side wall 204A and the second side wall 204B of the drawer 200, as shown in FIG. 4. Further, the lips 312A and 312B can provide structural rigidity to the mounting structure. As shown in FIG. 4, the fan assemblies 400 are accessible and able to be removed from the drawer 200 without removing a cover or sidewall.

The control board assembly 350 shown in FIG. 2 includes a support structure 352 and a printed circuit board 354. The support structure 352 can be a structure (e.g., bracket) that, when installed in the drawer 200, is coupled to and extends between the first side wall 204A and the second side wall 204B. The support structure 352 can comprise plastics or metals and include openings such that a fastener can couple the control board assembly 350 to the first side wall 204A and the second side wall 204B of the drawer 200. For example, the support structure 352 can be coupled to internal surfaces of the side walls. The support structure 352 can be coupled to the printed circuit board 354 by fasteners, adhesives, and the like. The printed circuit board 354 includes electrical connectors 356 that are shaped to mechanically and electrically couple to respective electrical connectors of the fan assemblies 400, as shown in FIG. 5. The printed circuit board 354 facilitates various electrical signals (e.g., power, control signals) to and from the fan assemblies 400.

FIG. 5 shows a section view of a side of one fan assembly 400 and the mounting structure 300 assembled with the drawer 200. FIG. 5 also shows a controller circuit board 214, a controller electrical connector 216, and the mid-plane circuit board 206 with an electrical connector 218. The controller circuit board 214 is electrically coupled to the mid-plane circuit board 206.

As shown in FIG. 5, the fan assembly 400 suspends from the mounting structure 300 such that there is a space 220 (e.g., gap) having a height H between the fan assembly 400 and the chassis 202. The space 220 provides a path for electrical components (e.g., the controller circuit board 214, the controller electrical connector 216) underneath the fan assembly 400 to increase design flexibility for routing various electrical components. In particular, the space 220 allows direct connection of the controller electrical connector 216 with the electrical connector 218—thus, eliminating the need for additional cables and/or bridge circuits to make such electrical connections. This space 220 is created and able to be utilized, in part, because of the low-profile design of the fan assemblies 400.

Although FIG. 5 shows the fan assembly 400 suspending (e.g., extending down) from a top side of the chassis 202, the fan assemblies 400 can extend from other parts of the chassis 202. For example, the mounting structure 300 or one or more of the fan assemblies 400 could extend from the first side wall 204A, the second side wall 204B, the bottom wall 204C, the middle walls 212A and 212B, etc. Further, although the Figures only show one mounting structure 300, the drawer 200 could include multiple mounting structures. For example, the drawer 200 could have one mounting structure for mounting one or more fan assemblies 400 to the first side wall 204A, another mounting structure for mounting one or more fan assemblies 400 to the second side wall 204B, and another mounting structure for mounting one or more fan assemblies 400 to the top cover. Further yet, although the Figures show the mounting structure 300 being separate from the walls of the chassis (e.g., the first side wall 204A, the second side wall 204B), the walls of the chassis could form or include mounting structures themselves to which the fan assemblies 400 are mounted to.

Figure 6:
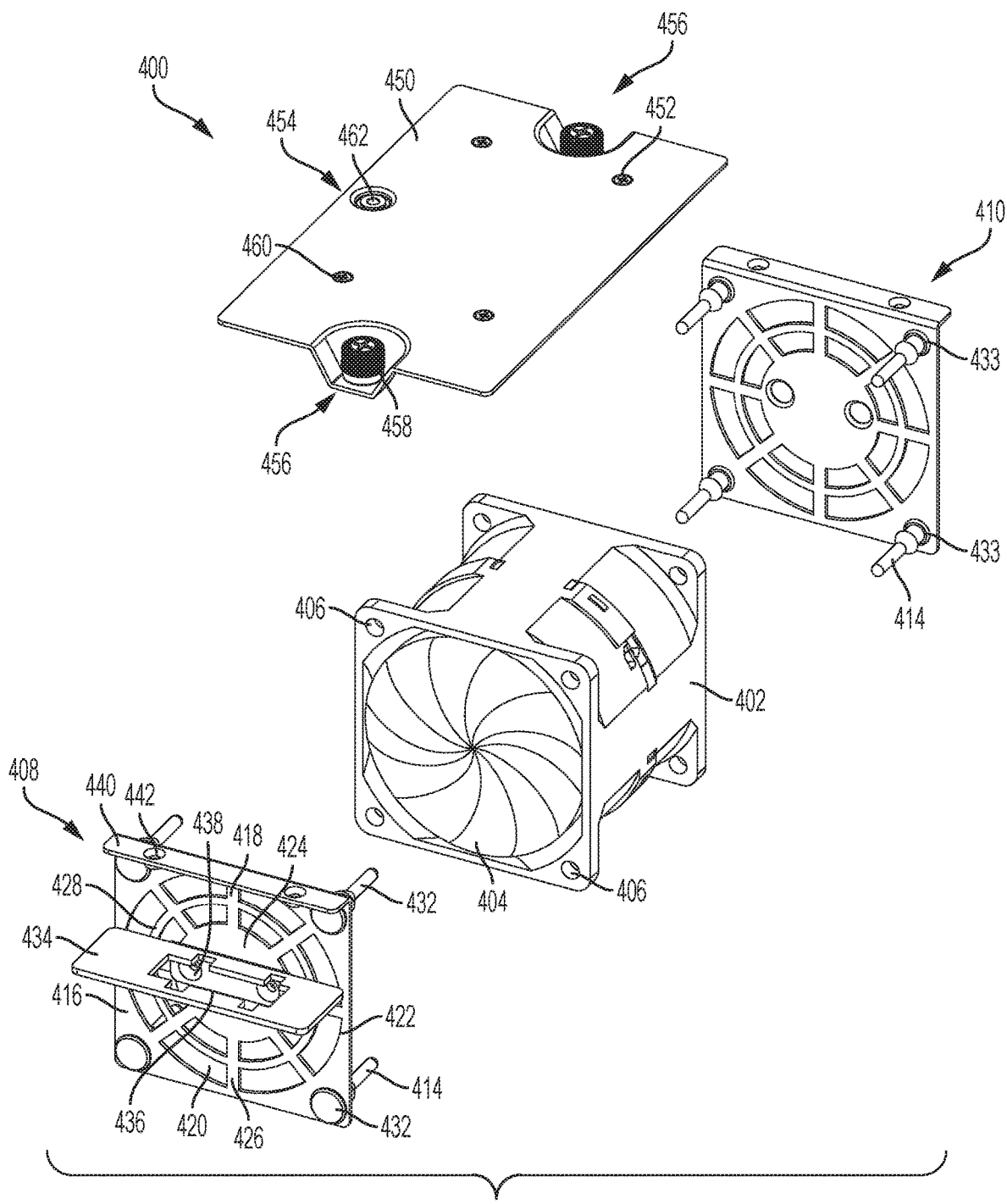
FIG. 6 shows an exploded, perspective view of a fan assembly, in accordance with certain embodiments of the present disclosure.
Figure 7A:
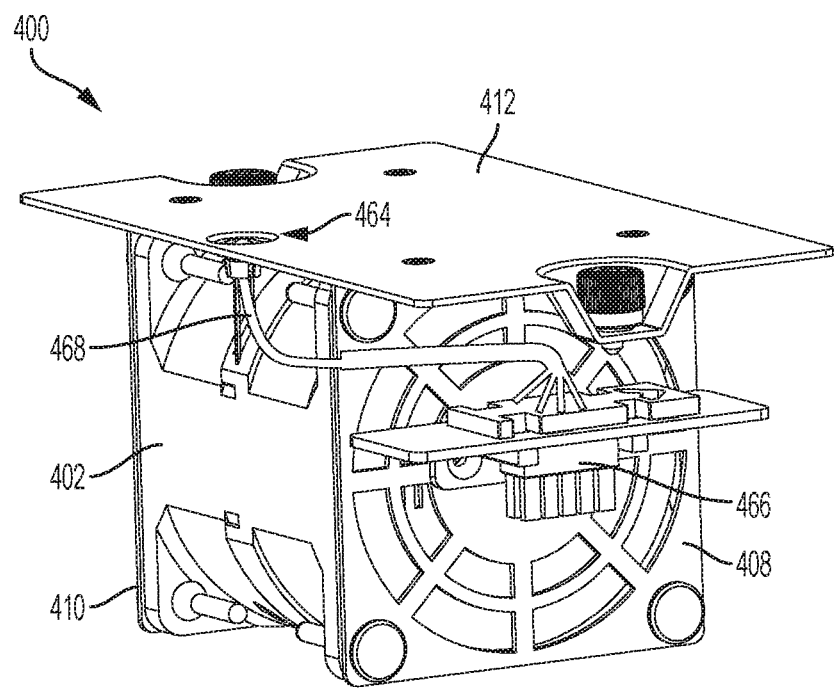
FIGS. 7A-7B show perspective views of a fan assembly, in accordance with certain embodiments of the present disclosure.
Figure 7B:
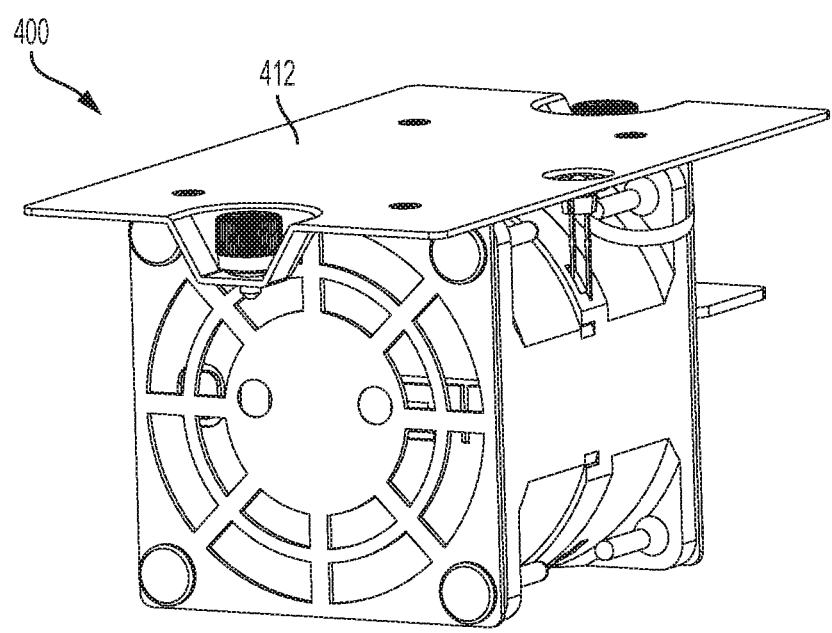

FIG. 6 shows an exploded view of the fan assembly 400, and FIGS. 7A-7B show the fan assembly 400 in its assembled state, ready to be installed in the drawer 200. The fan assembly 400 includes a fan module 402, which can be a single- or multi-rotor fan module. The fan module 402 includes a plurality of fan blades 404 that rotate to move air, which helps cool the drawer 200, and a plurality of mounting openings 406. The plurality of mounting openings 406 are distributed along the fan module 402 such that one set of mounting openings 406 are positioned on a first side of the fan module 402 and another set of mounting openings 406 are positioned on a second side of the fan module 402 opposite the first side.

The fan assembly 400 also includes a front cover 408, a back cover 410, a top cover 412, and a plurality of dampers 414. The front cover 408, the back cover 410, and the top cover 412 can comprise materials such plastics and metals. In certain embodiments, the front cover 408, the back cover 410, and the top cover 412 comprise plastic, which helps dampen vibration generated by the fan module 402. Although the front cover 408, the back cover 410, and the top cover 412 are shown are separate components in the Figures, the covers could be a unitary structure.

The front cover 408 includes a main wall 416 with a finger guard 418. The finger guard 418 includes a plurality of openings 420 that, together, generally form a circle-shaped opening having an outer circumference 422. The finger guard 418 is shown as having a central portion 424 and a plurality of spokes 426 that extend from the central portion 424 to the outer circumference 422. The finger guard 418 also includes a middle circumference portion 428 positioned between the central portion 424 and the outer circumference 422. The finger guard 418 is integral with the main wall 416 of the front cover 408 and thus eliminates the need for a separate finger guard. The finger guard 418 also allows for air to flow either to or from the fan module 402 so that the fan module 402 can cool the drawer 200. Further, the finger guard 418 helps prevent operators from contacting the fan module 402 itself, thus preventing potential injury.

The main wall 416 also includes openings that are shaped to receive the plurality of dampers 414. The plurality of dampers 414 extend through the openings of the main wall 416 and through the mounting openings 406 of the fan module 402 to couple the front cover 408 to the fan module 402. The plurality of dampers 414 can each include a head portion 430 and an extension portion 432. The extension portion 432 can extend through one of the openings of the main wall 416 and the mounting openings 406 of the fan module 402, while the head portion 430 rests on the main wall 416. In certain embodiments, the dampers 414 comprise a viscoelastic material (e.g., an elastomer such as a vinyl-based elastomer). In certain embodiments, the entire structure of the dampers 414 comprises an elastomer. In certain embodiments, only one of the head portion 430 and the extension portion 432 comprises an elastomer. The dampers 414 assist with dampening vibration generated by the fan module 402 and mitigate transfer of the generated vibration from the fan module 402 to other parts of the drawer 200 and the data storage system 100. In certain embodiments, the front cover 408 includes bosses or spacers (see 433 on the back cover 410) that are shaped to provide a space between the main 416 of the front cover 408 and the fan module 402 when the fan assembly 400 is fully assembled.

The front cover 408 may also include—or be coupled to—an electrical connector portion 434. The electrical connector portion 434 includes an opening 436 through which an electrical connector (see electrical connector 466 for the fan module 402 in FIG. 7A) can extend through. For example, the electrical connector 466 can couple to one of the electrical connectors 356 of the control board assembly 350 to power the fan module 402. The opening 436 of the electrical connector portion 434 can be shaped such that the electrical connector 466 can move between a non-secured position and a secured position. The electrical connector 466 can be snapped into and out of the secured position. Securing the position of the electrical connector 466 helps reduce vibration. In certain embodiments, the electrical connector portion 434 and the front cover 408 are unitarily formed of a single material. In certain embodiments, the electrical connector portion 434 is a separate component that is fastened to the front cover 408. For example, the electrical connector portion 434 can include openings 438 and the central portion 424 can include openings—examples of which are shown on the back cover 410—through which a fastener can extend through to couple the electrical connector portion 434 is to the front cover 408.

The front cover 408 also includes a lip portion 440 with openings 442. The lip portion 440 may extend perpendicular to the main wall 416. The openings 442 are shaped and arranged to receive fasteners to couple the front cover 408 to the top cover 412.

The back cover 410 is shown in FIG. 6 as including the same features as the front cover 408, except that the back cover 410 is shown without an electrical connector portion. As such, if the electrical connector portion 434 is a separate component to the front cover 408, the back cover 410 and the front cover 408 may be identical parts.

The top cover 412 includes a main wall 450 with mounting openings 452 and an LED mounting portion 454. The top cover 412 also includes two recessed portions 456 for accommodating fasteners 458 (e.g., thumb screws) so that the fasteners 458 do not extend past the main wall 450. The fasteners 458 are used to couple the fan assembly 400 to the mounting structure 300. The top cover 412 is shaped such that the top cover 412 can at least partially rest on the support surface 304 of the mounting structure 300. Further, the rest of the fan assembly 400 (or individual components of the fan assembly 400) has a smaller horizontal cross-section footprint than the top cover 412 such that the rest of the fan assembly 400 can extend through the aperture 306 of the mounting structure 300 while the top cover 412 rests on the support surface 304 of the mounting structure 300.

The mounting openings 452 of the main wall 450 are arranged such that fasteners 460 can extend through the mounting openings 452 and couple to respective openings 442 in the lip portions 440 of the front cover 408 and the back cover 410. The LED (light emitting diode) mounting portion 454 includes an opening 462 through which electrical wires to power an LED (e.g., LED 464 in FIG. 7A) can be routed. The LED mounting portion 454 helps manage electrical wires to minimize the electrical wires blocking or inhibiting air flow to and from the fan module 402.

As shown in FIG. 5, when the fan assembly 400 is assembled to the drawer 200, the main wall 450 of the top cover 412 of the fan assembly 400 is positioned outside the drawer 200 while the rest of the fan assembly 400 is positioned within the drawer 200.

FIGS. 7A and 7B show the fan assembly 400 in its assembled state. When assembled, the fan module 402 is electrically coupled to the electrical connector 466 via one or more wires 468 that extend between the fan module 402 and the electrical connector 466. In certain embodiments, the front cover 408 includes an additional opening such that the wires 468 can pass through the front cover to the electrical connector 466.

The components and configuration of the fan assembly 400 help isolate vibration generated by the fan module 402 from other parts of the drawer 200. As discussed above, the dampers 414 comprise a material, such as elastomers, that couple the fan module 402 to the front cover 408 or the back cover 410 while mitigating transfer of vibration from the fan module 402 to the front cover 408, the back cover 410, etc. Further, the front cover 408 and the back cover 410 can comprise a plastic material that mitigates transfer of vibration compared to a metal material. The effect of the fan module's vibration on, for example, the data storage devices 106 in the drawer 200, is further mitigated because the vibration would have to transfer from the fan module 402, through the dampers 414, through either the front cover 408 or the back cover 410, through the top cover 412, through the mounting structure 300, and so on. As such, the fan assembly 400 helps isolate vibration from the fan module 402.

Also, as mentioned above, the fan assembly 400 is designed to be compact. For example, the periphery or footprint of the front cover 408 and the back cover 410 is substantially the same as the periphery or footprint of the fan module 402. As such, the front cover 408 and the back cover 410 do not increase much (if at all) the overall footprint of the fan module 402. The compact design is further realized, in certain embodiments, by only having three of the six sides of the fan module being covered by covers (e.g., the front cover 408, the back cover 410, and the top cover 412). The fan assembly's compact design provides more space within the drawer for routing electrical components and allows for direct connection of the controller electrical connector 216 with the electrical connector 218.

Further, methods for installation and removal of the fan assembly 400 with the mounting structure 300 do not require use of tools such as screwdrivers, etc., and does not require many parts. For example, to remove the fan assembly 400 from the mounting structure 300, an operator can manually unscrew the thumb screws 458 to allow the fan assembly 400 to be removed from the mounting structure 300. A replacement fan assembly 400 can then be installed by coupling the fan assembly 400 to the mounting structure 300 and tightening the thumb screws 458 to secure the fan assembly 400 to the drawer 200. As such, an operator can quickly remove the fan assembly 400 from the mounting structure 300 and quickly install a replacement fan assembly 400. As noted above, the fan assemblies 400 are accessible and able to be removed from the drawer 200 without removing a separate cover or sidewall. The ability to quickly remove and install fan assemblies helps reduce the risk of overheating the data storage devices or other components in the drawer 200 while the fan assembly 400 is being replaced.

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

We claim:

1. A system comprising:
   a drawer including a bottom wall and a mounting structure, the mounting structure having a support surface and an aperture;
   a fan assembly extending through the aperture, extending at least partially between the mounting structure and the bottom wall, and including a fan module and a top cover, the top cover coupled to and resting on the support surface such that the fan module is suspended, the fan assembly and the bottom wall being separated by a gap;
   a circuit board having a first electrical connector and that at least partially extends through the gap between the fan assembly and the drawer; and
   a mid-plane circuit board having a second electrical connector that is directly coupled to the first electrical connector.

2. The system of claim 1, wherein the fan assembly includes:
   a front cover coupled to the fan module and to the top cover; and
   a back cover coupled to the fan module and to the top cover.

3. The system of claim 2, wherein the fan module includes a first set of mounting openings and a second set of mounting openings, wherein the front cover is coupled to the fan module via a first set of dampers that extend through respective openings of the first set of mounting openings, and wherein the back cover is coupled to the fan module via a second set of dampers that extend through respective openings of the second set of mounting openings.

4. The system of claim 2, wherein the front cover and the back cover each include a finger guard.

5. The system of claim 2, wherein the top cover is coupled to the front cover via a first fastener.

6. The system of claim 5, wherein the top cover is coupled to the back cover via a second fastener.

7. The system of claim 2, wherein the top cover is coupled to the front cover by a first plurality of respective fasteners and to the back cover by a second plurality of respective fasteners.

8. The system of claim 1, wherein the mounting structure is coupled to a drawer chassis.

9. The system of claim 1, wherein the mounting structure is part of a drawer chassis.

10. The system of claim 1, wherein the circuit board is electrically coupled to the mid-plane circuit board without electrical cables or bridge circuits.

11. The system of claim 1, wherein the mounting structure is coupled to a first sidewall and a second sidewall of the drawer and includes a plurality of apertures and support surfaces, the system further comprising:
    a plurality of fan assemblies each partially extending through one of the plurality of apertures and suspending from one of the plurality of support surfaces.

12. The system of claim 1, further comprising:
    a control board assembly including a support structure coupled to a first sidewall and a second sidewall of the drawer, a printed circuit board coupled to the support structure, and an electrical connector coupled to the printed circuit board,
    wherein the fan assembly includes an electrical connector that is electrically coupled to the electrical connector of the printed circuit board.

13. The system of claim 1, wherein a main wall of the top cover is positioned outside the drawer and the rest of the fan assembly is positioned within the drawer.

14. The system of claim 1, wherein the top cover includes a light emitting diode (LED) mounting portion, and wherein an LED is mechanically coupled to the LED mounting portion and electrically coupled to the fan module.

15. The system of claim 1, wherein the fan assembly includes only a single fan module.

16. The system of claim 1, wherein the back cover includes an electrical connector portion with an opening for receiving an electrical connector.

17. The system of claim 1, wherein the top cover includes a plurality of recessed portions each with a mounting opening for receiving a fastener.

18. The system of claim 17, wherein the top cover is directly and fixedly coupled to the front cover and to the back cover.

19. The system of claim 18, wherein the top cover has a larger footprint than the fan module.

20. The system of claim 1, wherein the top cover includes a plurality of recessed portions each with a mounting opening, wherein a thumb screw extends through each mounting opening to couple the fan assembly to the drawer.

* * * * *